(12) United States Patent
An et al.

(10) Patent No.: US 9,835,740 B2
(45) Date of Patent: *Dec. 5, 2017

(54) APPARATUS AND METHOD FOR PET DETECTOR

(71) Applicant: SHANGHAI UNITED IMAGING HEALTHCARE CO., LTD., Shanghai (CN)

(72) Inventors: Shaohui An, Shanghai (CN); Qiang Zhang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/454,756

(22) Filed: Mar. 9, 2017

(65) Prior Publication Data

US 2017/0176610 A1    Jun. 22, 2017

Related U.S. Application Data

(63) Continuation of application No. 14/822,892, filed on Aug. 10, 2015.

(51) Int. Cl.
  *G01T 1/20* (2006.01)
  *G01T 1/29* (2006.01)
  *G01T 1/164* (2006.01)

(52) U.S. Cl.
  CPC .......... *G01T 1/2985* (2013.01); *G01T 1/1644* (2013.01); *G01T 1/2018* (2013.01)

(58) Field of Classification Search
  CPC .................. G01T 1/2985; G01T 1/2018
  See application file for complete search history.

(56) References Cited

U.S. PATENT DOCUMENTS 5,319,204 A    6/1994 Wong
5,451,789 A    9/1995 Wong et al.
(Continued)

FOREIGN PATENT DOCUMENTS

CN    104795304 A    0/7201
CN    101071705 A    11/2007
(Continued)

OTHER PUBLICATIONS

Hong et al., An investigation into the use of Geiger-mode solid-state photomultipliers for simultaneous PET and MRI acquisition. IEEE Transactions on Nuclear Science, 2008, 55(3): 882-88.
(Continued)

*Primary Examiner* — Casey Bryant
(74) *Attorney, Agent, or Firm* — Metis IP LLC

(57) ABSTRACT

A PET detector and method thereof are provided. The PET detector may include: a crystal array including a plurality of crystal elements arranged in an array and light-splitting structures set on surfaces of the plurality of crystal elements, the light-splitting structures jointly define a light output surface of the crystal array; a semiconductor sensor array, which is set in opposite to the light output surface of the crystal array and is suitable to receive photons from the light output surface, the semiconductor sensor array comprises a plurality of semiconductor sensors arranged in an array.

18 Claims, 10 Drawing Sheets

(56) References Cited

U.S. PATENT DOCUMENTS

| | | | |
|---|---|---|---|
| 5,453,623 | A | 9/1995 | Wong et al. |
| 5,504,386 | A | 4/1996 | Kyushima et al. |
| 5,825,031 | A | 10/1998 | Wong et al. |
| 5,866,908 | A | 2/1999 | Novak |
| 6,222,192 | B1 | 4/2001 | Sekela et al. |
| 6,245,184 | B1 | 6/2001 | Riedner et al. |
| 6,287,128 | B1 | 9/2001 | Jones et al. |
| 6,310,349 | B1 | 10/2001 | Wong et al. |
| 6,525,322 | B2 | 2/2003 | Wong et al. |
| 6,744,053 | B2 | 6/2004 | Wong et al. |
| 6,749,761 | B1 | 6/2004 | Andreaco et al. |
| 6,936,822 | B2 | 8/2005 | Wong et al. |
| 6,956,214 | B2 | 10/2005 | Wong et al. |
| 7,071,474 | B2 | 7/2006 | Wong et al. |
| 7,091,490 | B2 | 8/2006 | Sumiya et al. |
| 7,193,208 | B1 | 3/2007 | Burr et al. |
| 7,238,943 | B2 | 7/2007 | Wong et al. |
| 7,388,209 | B1 | 6/2008 | Gormley et al. |
| 7,405,404 | B1 | 7/2008 | Shah |
| 7,638,760 | B1 | 12/2009 | Heipp et al. |
| 2003/0226972 | A1 | 12/2003 | Wong et al. |
| 2004/0021082 | A1 | 2/2004 | Wong et al. |
| 2004/0026624 | A1 | 2/2004 | Wainer et al. |
| 2004/0054248 | A1 | 3/2004 | Kimchy et al. |
| 2004/0108471 | A1 | 6/2004 | Luo et al. |
| 2004/0124360 | A1 | 7/2004 | Levin |
| 2004/0124361 | A1 | 7/2004 | Yamakawa |
| 2004/0129886 | A1 | 7/2004 | Lecoq |
| 2004/0173750 | A1 | 9/2004 | Welsh et al. |
| 2004/0188624 | A1 | 9/2004 | Wong et al. |
| 2004/0195512 | A1* | 10/2004 | Crosetto ............... A61B 6/037 250/363.04 |
| 2004/0217292 | A1 | 11/2004 | Moyers et al. |
| 2005/0072914 | A1 | 4/2005 | Chapman |
| 2005/0087693 | A1* | 4/2005 | Sumiya ............... G01T 1/2928 250/367 |
| 2005/0113667 | A1 | 5/2005 | Schlyer et al. |
| 2005/0139777 | A1 | 6/2005 | Rostaing et al. |
| 2005/0167599 | A1 | 8/2005 | Schlyer et al. |
| 2005/0178971 | A1 | 8/2005 | Hoge |
| 2005/0199817 | A1 | 9/2005 | Aoki |
| 2005/0211906 | A1 | 9/2005 | Tonami et al. |
| 2005/0230630 | A1 | 10/2005 | Yanagita et al. |
| 2005/0247879 | A1 | 11/2005 | Xie et al. |
| 2005/0253076 | A1 | 11/2005 | Wollenweber et al. |
| 2005/0285042 | A1 | 12/2005 | Joung |
| 2006/0000979 | A1 | 1/2006 | Xie et al. |
| 2006/0065826 | A1 | 3/2006 | Wang et al. |
| 2006/0067466 | A1 | 3/2006 | Hawman |
| 2006/0076497 | A1* | 4/2006 | Yamada ............... G01T 1/1603 250/367 |
| 2006/0076519 | A1 | 4/2006 | Hawman et al. |
| 2006/0081786 | A1 | 4/2006 | Berthold et al. |
| 2006/0138315 | A1 | 6/2006 | Williams et al. |
| 2006/0145081 | A1 | 7/2006 | Hawman |
| 2006/0151705 | A1 | 7/2006 | Manjeshwar et al. |
| 2006/0151707 | A1 | 7/2006 | Wellnitz et al. |
| 2006/0186341 | A1 | 8/2006 | Ueno et al. |
| 2006/0197022 | A1 | 9/2006 | Burr et al. |
| 2006/0197025 | A1 | 9/2006 | Burr et al. |
| 2006/0261279 | A1 | 11/2006 | Crosetto |
| 2006/0266947 | A1 | 11/2006 | Krieg et al. |
| 2006/0284096 | A1 | 12/2006 | Krieg et al. |
| 2006/0284122 | A1 | 12/2006 | Caldwell |
| 2007/0001121 | A1 | 1/2007 | Gally et al. |
| 2007/0025522 | A1 | 2/2007 | Fenster et al. |
| 2007/0029491 | A1 | 2/2007 | Olden et al. |
| 2007/0030141 | A1 | 2/2007 | Manneschi et al. |
| 2007/0061099 | A1 | 3/2007 | Turner et al. |
| 2007/0069136 | A1 | 3/2007 | Hawman |
| 2007/0069138 | A1 | 3/2007 | Wang |
| 2007/0080295 | A1 | 4/2007 | Hamill |
| 2007/0096027 | A1 | 5/2007 | McParland |
| 2007/0117439 | A1 | 5/2007 | Yokoi et al. |
| 2007/0176110 | A1 | 8/2007 | Yokoi et al. |
| 2007/0194242 | A1 | 8/2007 | Fiedler et al. |
| 2007/0262260 | A1 | 11/2007 | Shah |
| 2007/0278414 | A1 | 12/2007 | Yokoi et al. |
| 2007/0290137 | A1 | 12/2007 | Tonami et al. |
| 2008/0007173 | A1 | 1/2008 | Yamaguchi et al. |
| 2008/0042070 | A1 | 2/2008 | Levin |
| 2008/0099685 | A1 | 5/2008 | Karp et al. |
| 2008/0116383 | A1 | 5/2008 | Joung et al. |
| 2008/0135770 | A1 | 6/2008 | Arseneau |
| 2008/0283760 | A1 | 11/2008 | Tsuchiya et al. |
| 2008/0317320 | A1 | 12/2008 | Van Stevendaal et al. |
| 2009/0032714 | A1 | 2/2009 | Peter et al. |
| 2009/0173885 | A1 | 7/2009 | Zeitler et al. |
| 2009/0194701 | A1 | 8/2009 | Seino et al. |
| 2009/0230285 | A1 | 9/2009 | Wright |
| 2009/0259728 | A1 | 10/2009 | Berisford et al. |
| 2010/0010343 | A1 | 1/2010 | Daghighian et al. |
| 2010/0025587 | A1 | 2/2010 | Benlloch Baviera et al. |
| 2010/0116999 | A1 | 5/2010 | Tumer et al. |
| 2010/0134335 | A1 | 6/2010 | Park et al. |
| 2010/0148074 | A1 | 6/2010 | Menge et al. |
| 2010/0155610 | A1 | 6/2010 | Menge et al. |
| 2011/0227621 | A1 | 9/2011 | Ridgers |
| 2011/0253901 | A1 | 10/2011 | Chmeissani Raad et al. |
| 2011/0315855 | A1 | 12/2011 | Perlman et al. |
| 2012/0012751 | A1 | 1/2012 | Saenger |
| 2012/0104259 | A1 | 5/2012 | Mann |
| 2013/0264464 | A1 | 10/2013 | Heifets et al. |
| 2013/0275054 | A1 | 10/2013 | Simpson et al. |
| 2013/0307713 | A1 | 11/2013 | Kawaguchi et al. |
| 2013/0313437 | A1 | 11/2013 | Li et al. |
| 2014/0138548 | A1 | 5/2014 | Li et al. |
| 2015/0119694 | A1 | 4/2015 | Mihlin et al. |

FOREIGN PATENT DOCUMENTS

| | | |
|---|---|---|
| CN | 101561506 A | 10/2009 |
| CN | 101806912 A | 8/2010 |
| CN | 101833106 A | 9/2010 |
| CN | 101839991 A | 9/2010 |
| CN | 102073058 A | 5/2011 |
| CN | 101561508 A | 7/2011 |
| CN | 102129082 A | 7/2011 |
| CN | 102331599 A | 1/2012 |
| CN | 102565841 A | 7/2012 |
| CN | 103158203 A | 6/2013 |
| CN | 203062650 U | 7/2013 |
| CN | 203149126 U | 8/2013 |
| CN | 103376458 A | 10/2013 |
| CN | 103376459 A | 10/2013 |
| CN | 103567685 A | 2/2014 |
| CN | 103592671 A | 2/2014 |
| CN | 103668465 A | 3/2014 |
| CN | 105425270 A | 3/2014 |
| CN | 104184473 A | 12/2014 |
| CN | 104414671 A | 3/2015 |
| CN | 104434160 A | 3/2015 |
| JP | H06150877 A | 5/1994 |
| JP | 2005087366 A | 4/2005 |
| JP | 2008145335 A | 6/2008 |
| JP | 2000098040 A | 4/2017 |

OTHER PUBLICATIONS

Kwon et al., Development of small-animal PET prototype using silicon photomultiplier (SiPM): initial results of phantom and animal imaging studies[J]. Journal of Nuclear Medicine, 2011, 52(4): 572-79.

Wang et al., Influence of scintillator shape and film reflector on detector efficiency. Nuclear Techniques, 2011, 34 (12): 905-08.

* cited by examiner

APPARATUS AND METHOD FOR PET DETECTOR

CROSS-REFERENCE TO RELATED APPLICATIONS

The application is a Continuation of U.S. application Ser. No. 14/822,892, filed on Aug. 10, 2015.

TECHNICAL FIELD

The present disclosure relates to the technical field of optical detecting, to be more specific, to an apparatus and a method for a PET detector.

BACKGROUND

Generally, positron emission tomography (PET) detectors have been set in various large medical devices such as, positron emission tomography-computed tomography (PET-CT) devices, positron emission tomography-magnetic resonance imaging (PET-MM) devices, in which PET technologies are applied. PET detectors are used to receive γ rays generated from a patient's body and to provide information related to the locations where photons are excited by γ rays in the sensors to other components of the large medical devices, so that the other components of the large medical devices may process appropriately based on the location information.

As shown in FIG. 1, currently, a PET detector typically includes a crystal array 102, an avalanche photo diode (APD) array 104 coupled with the crystal array 102, and a light guide 106 which is set between the crystal array 102 and the APD array 104. Among them, the crystal array 102 is formed by multiple crystal elements, which are arranged according to a certain design. The APD array 104 is formed by multiple APDs, which are arranged according to a certain design. Each APD contacts with at least one crystal element.

The γ rays generated in the patient's body are received by a certain crystal element in the crystal array 102. The γ rays excite photons inside the crystal element. The photons transmit among several crystal elements in the crystal array 102, and ultimately enter into the APD array 104 through the light guide 106. And then they are received by the APD array.

When the γ rays excite photons inside the crystal element, optical transmission loss may be caused by the light guide 106. As such, only a portion of the excited photons may enter into the APD array 104, resulting in a lower resolution of the PET detector.

SUMMARY

The embodiments of the present invention is intended to solve the problem to enhance the resolution of a PET detector.

To solve the problem, according to embodiments of the present invention a PET detector is provided, which comprises:

a crystal array, which comprises a plurality of crystal elements and a light splitting structure mounted on a surface of each of the plurality of crystal elements, the light splitting structures defining a light output surface of the crystal array jointly;

a semiconductor sensor array comprising a plurality of semiconductor sensors for receiving photons from the light output surface, each of the plurality of semiconductor sensors contacting at least a portion of the light output surface of the crystal array.

In some embodiments, more than one of the plurality of crystal elements in the crystal array may be coupled with one semiconductor sensor of the semiconductor sensor array.

In some embodiments, at least one semiconductor sensor of the semiconductor sensor array may be coupled with each of the plurality of crystal elements in the crystal array.

In some embodiments, the coupling comprises a contact between the semiconductor sensors and the crystal elements directly or through an adhesive material.

In some embodiments, a center-of-gravity of the semiconductor sensor array may coincide with a center-of-gravity of the crystal array.

In some embodiments, the semiconductor sensor array may completely or partially cover the light output surface.

In some embodiments, the light-splitting structure may include a light-reflective membrane or a white light-reflective coating.

In some embodiments, the PET detector further comprises a first amplifier, an input terminal of the first amplifier being connected with an output terminal of a semiconductor sensor in a predetermined row of the semiconductor sensor array.

In some embodiments, the PET detector further comprises a second amplifier, an output terminal of the first amplifier being connected with an output terminal of a semiconductor sensor in a predetermined column of the semiconductor sensor array.

In some embodiments, the light-splitting structures on the surfaces of the crystal elements may be set based on light-receiving areas of the semiconductor sensors, a relative positioning between the semiconductor sensors, relative positioning between the semiconductor sensors and the crystal array.

In some embodiments, a resolution of the crystal elements in an image may relate to a number or positioning of the semiconductor sensors.

According to embodiments of the present invention, a method for setting a PET detector is further provided, which comprises:

adjusting an area of a light-splitting structure on each of a plurality of crystal elements in a crystal array, the light-splitting structures jointly forming a light output surface of the crystal array; and setting the semiconductor sensor array in contact with at least a portion of the light output surface of the crystal array.

In some embodiments, the adjusting areas of light-splitting structures set on each crystal element in the crystal array comprises:

adjusting a probability of photon occurrence in a crystal element;

if the probability of photon occurrence in the crystal element satisfies a resolution condition, setting the area of the crystal element according to the area of the light-splitting structure corresponding to the probability of photon occurrence.

In some embodiments, the adjusting of the probability of photon occurrence in the crystal element comprises:

adjusting the probability of photon occurrence in a first crystal element according to the following equation:

$$P(m) = \frac{N!}{m!(N-m)!} p^m (1-p)^{(N-m)}$$

wherein N represents a total number of the photons excited in a second crystal element in the crystal array other than the first crystal element, m represents a number of the photons excited in the first crystal element when N photons are excited in the second crystal element, p represents a probability that when a photon is excited in the second crystal element the photon occurs in the first crystal element, and P represents a probability that m photons occur in the first crystal element when N photons are excited in the second crystal element.

According to embodiments of the present invention, a detection method is further provided, which comprises:
  providing a PET detector;
  receiving a γ ray by a crystal element of the PET detector;
  receiving photons excited by the γ ray in the crystal element by a semiconductor sensor of the PET detector;
  determining a position where the γ ray generates the photons in the crystal element according to an output of the semiconductor sensor.

In some embodiments, the determining of the position comprises using a center-of-gravity readout method.

In some embodiments, a positron emission tomography (PET) detector is provided. The PET detector may include:
  a crystal array, the crystal array comprising a plurality of crystal elements; each of the plurality of crystal elements extending along up-to-down direction, and having an upper side and a lower side, and a surrounding surface between the upper side and the lower side;
  a light-splitting structure mounted on the surface of each of the plurality of crystal elements, the light-splitting structure corporately with the crystal array to define a light output surface; and
  a semiconductor sensor array comprising a plurality of semiconductor sensors for receiving photons from the light output surface, each of the plurality of semiconductor sensors sharing at least a portion of the light output surface of the crystal array.

Embodiments of the present invention may have the following features:

By setting light-splitting structures on the crystal elements, the transmission distance of photons may be effectively shorten, compared to that of photons in the case of setting light guide between the crystal array and semiconductor sensors, therefore light transmission loss may be avoided, and the resolution of the PET detector may be enhanced.

By coupling a portion of crystal elements in the crystal array with the corresponding semiconductor sensors in the semiconductor sensor array, there is no need to couple every crystal element in the crystal array with its corresponding semiconductor sensor, which makes the setting of the number of semiconductor sensors more flexible. Therefore, when the same number of crystal elements are used, less semiconductor sensors may be used to satisfy the same resolution of crystal elements in the same image. Thus the cost of the PET detector may be reduced.

By setting the center-of-gravity of the semiconductor sensor array in coincidence with the center-of-gravity of the crystal array, the use of the center-of-gravity readout method to determine the location where photons are excited may be more convenient.

As the semiconductor sensor array may cover the light output surface completely or partially, the setting of the number and positions of sensors may be more flexible, therefore, when the same number of crystal elements is used, less semiconductor sensors may be used to satisfy the same resolution of crystal elements in the same image. Thus the cost of the PET detector may be reduced.

By setting the first amplifier and the second amplifier, when the center-of-gravity readout method is used to determine the location where photons are excited, the location where photons are excited may be determined directly according to the output of the first amplifier and the second amplifier, and it is not required to read every output of semiconductor sensors. Therefore the amount of data processed to determine the location where photons are excited, and the difficulty to determine the locations of photons may be reduced.

By adjusting the probability of photon occurrence in the whole crystal element according to the equation $$P(m) = \frac{N!}{m!(N-m)!} p^m (1-p)^{(N-m)}$$

and adjusting the area of a light-splitting structure on a corresponding crystal element, a desired spatial resolution of images may be satisfied more rapidly.

DETAILED DESCRIPTION

Figure 1:
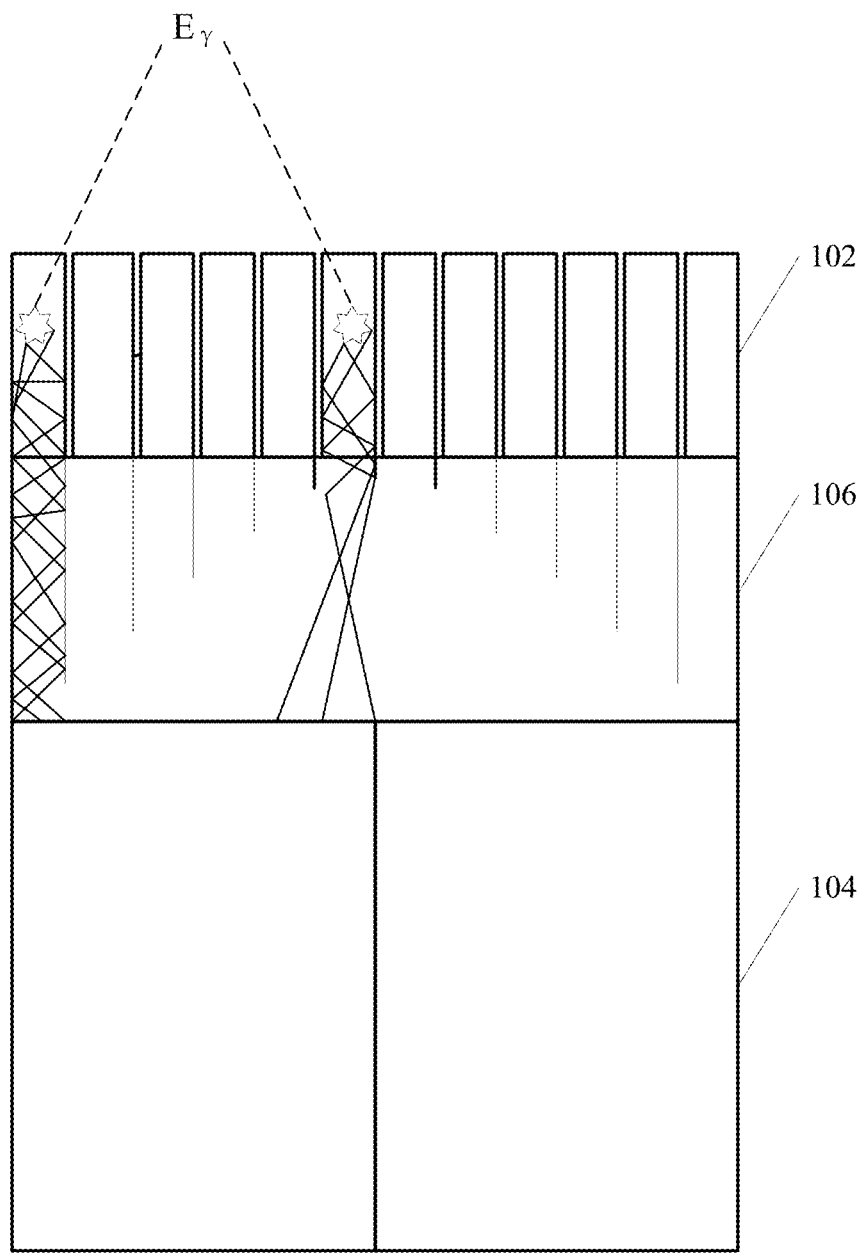
FIG. 1 is a diagram illustrating a longitudinal section of a PET detector in related art.

In a PET detector structure as shown in FIG. 1, after a γ ray generates photons in a crystal element, the photons may enter an APD array 104 through a light guide 106. The arrangement of the light guide 106 may increase the distance of the photon transmission, and may cause some loss in optical transmission and a decrease in the PET detector resolution.

The above-mentioned features of the present disclosure will become further apparent from the following detailed description of the specific embodiment of the present invention with reference to the accompanying drawings.

Figure 2:
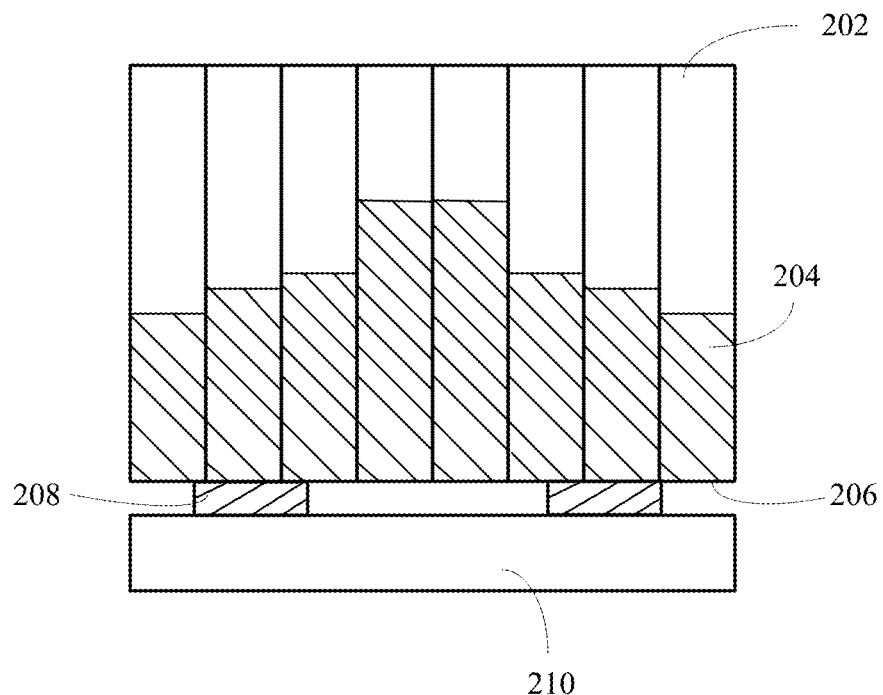
FIG. 2 is a diagram illustrating a longitudinal section of a PET detector according to one embodiment of the present disclosure.

FIG. 2 illustrates an exemplary PET detector according to some embodiments of the present disclosure. As illustrated, the PET detector may include a crystal array and a semiconductor sensor array.

The crystal array may include multiple crystal elements 202 arranged in an array, and optionally a light-splitting structure 204 that is coupled to the surface of the crystal elements 202. The light-splitting structures 204 mounted on the multiple crystal elements 202 may define a light output surface 206 of the crystal array. The semiconductor sensor array may be mounted in opposite to the light output surface 206 of the crystal array. The semiconductor sensor array may comprise multiple semiconductor sensors 208 arranged in an array. The semiconductor sensor array is integrated on the driver board 210. The driver board 210 is connected to the semiconductor sensor 208, applicable to drive the operation of the corresponding semiconductor sensor.

Each of the crystal elements 202 may correspond to a light output surface. A light output surface of a given crystal element 202 may refer to a surface of the given crystal element through which a photon exits the given crystal element to enter corresponding a semiconductor sensor 208 corresponding to the given crystal element. In some embodiments of the present disclosure, the light output surfaces 206 may include the light output surfaces of crystal elements 202.

Figure 3:
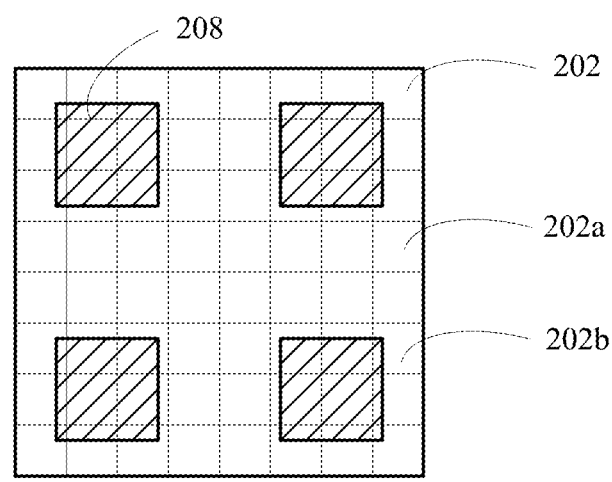
FIGS. 3-7 are diagrams illustrating examples of a cross section of a PET detector in accordance with some embodiments of the present disclosure.
Figure 4:
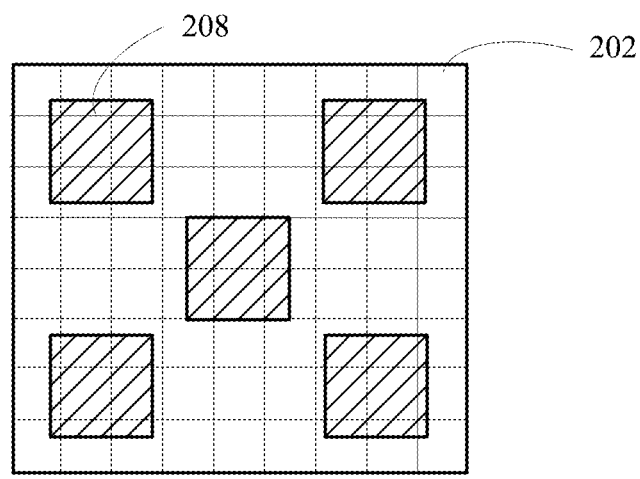
Figure 5:
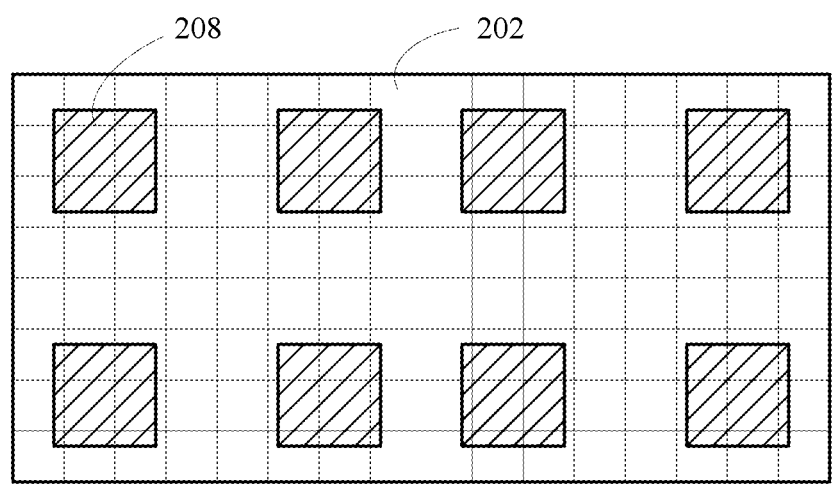

The crystal array may include any suitable number of crystal elements 202. The crystal elements 202 may be arranged in any suitable manner. As an example, the crystal array comprises three or more crystal elements 202. As another example, as shown in FIGS. 3-5, the crystal elements 202 may be arranged in an 8×8 array, an 8×9 array, an 8×19 array, etc. In some embodiments, the number of crystal elements 202 in the crystal array may be determined based on the dimensions of the PET detector 200. For example, a larger PET detector may include a greater number of crystal elements 202. Various numbers of crystal elements may correspond to various sizes of PET detectors.

Each crystal element 202 may be made of various materials, such as one or more of bismuth germanium oxide, lutetium oxyorthosilicate, lutetium yttrium oxyorthosilicate, lutetium gadolinium oxyorthosilicate, gadolinium orthosilicate, yttrium orthosilicate, barium fluoride, sodium iodide, cesium iodide, lead tungstate, yttrium aluminum perovskite, lanthanum (III) bromide, lanthanum (III) chloride, lutetium aluminum perovskite, lutetium pyrosilicate, lutetium aluminate and lutetium iodide, etc.

A γ ray may excite one or more photons in the crystal array. For example, the γ ray may excite multiple photons in a crystal element 202 (also referred to herein as the "first crystal element"). One or more of the excited photons may travel towards a light-splitting structure 204 coupled to the first crystal element. Upon receiving one or more of the excited photons, the light-splitting structure 204 may change the path of the received photons. For example, the received photons may be reflected by the light-splitting structure and may then enter a semiconductor sensor corresponding to the first crystal element through a surface of the first crystal element (e.g., the light output surface of the crystal element 202 that may be used to define light output surface 208). In some embodiments, one or more of the photons excited in the first crystal element may enter into a semiconductor sensor corresponding to another crystal element in the crystal array (also referred to herein as the "second crystal element") through a surface of second crystal element (e.g., a light output surface of the second crystal element that may be used to define the light output surface 206). In some embodiments, the semiconductor sensor corresponding to the first crystal element and the semiconductor sensor corresponding to the second crystal element may or may not be the same. In some embodiments, a particular semiconductor sensor of the semiconductor sensor array may receive photons from a surface of a crystal element used to define the light output surface, or from respective surfaces of multiple crystal elements used to define the light output surface.

In some embodiments, as the semiconductor sensors array receive photons from the light output surface of the crystal array, the semiconductor sensors may be coupled to the crystal elements in any suitable manner. For example, the semiconductor sensors may contact with the crystal elements through one or more adhesive materials. Examples of the adhesive material include silicone grease and/or any other suitable material that may be used to couple a crystal element and a semiconductor sensor.

As another example, a portion of the crystal elements of the crystal array may be coupled to one or more semiconductor sensors 208 of the semiconductor sensor array, which allows the semiconductor sensors to receive photons from the light output surface of the crystal array. Wherein the portion of crystal elements of the crystal array may correspond to one or more semiconductor sensors.

FIG. 3 is a schematic diagram of a cross section of a PET detector in accordance with some embodiments of the disclosure. In some embodiments, the PET detector of FIG. 3 may be the PET detector as described above in connection with FIG. 2. The crystal elements and the semiconductor sensors of FIG. 3 may be the same as one or more of the crystal elements 202 and the semiconductor sensors 206 of FIG. 1, respectively.

As illustrated, the crystal array of the PET detector may be and/or include an 8×8 array of crystal elements 202. The semiconductor sensor array may be and/or include a 2×2 array of semiconductor sensors. The crystal elements 202 may include one or more crystal elements 202a that are coupled to one or more semiconductor sensor 208. The crystal elements may also include one or more crystal elements 202b that are not coupled to a semiconductor sensor 208. In some embodiments, a portion of the crystal array (e.g., one or more crystal elements 202a) may correspond to (e.g., be coupled to) a semiconductor sensor 208. For example, as shown in FIG. 3, four portions of the crystal array may correspond to four semiconductor sensors 208 of the semiconductor sensor array, respectively. In some embodiments, after the γ ray excites photons within a crystal element 202b that is not coupled to a semiconductor sensor 208, the photons may be transmitted into one or more crystal elements 202a (e.g., crystal elements that are covered by one or more semiconductor sensors 208) via the light-splitting structure coupled to a surface of the crystal element 202b. A semiconductor sensor corresponding to the crystal element 202a may then receive the photons.

According to another embodiment of the present disclosure, at least one semiconductor sensor of the semiconductor sensors array is coupled to the corresponding crystal elements of the crystal array, such that the semiconductor sensors may receive photons from the light output surface of the crystal array. Wherein within the semiconductor array, one or more semiconductors may have corresponding crystal elements within the crystal array, so long as one semiconductor sensor of the semiconductor sensors array may receive photons from the light output surface of the crystal array.

Figure 6:
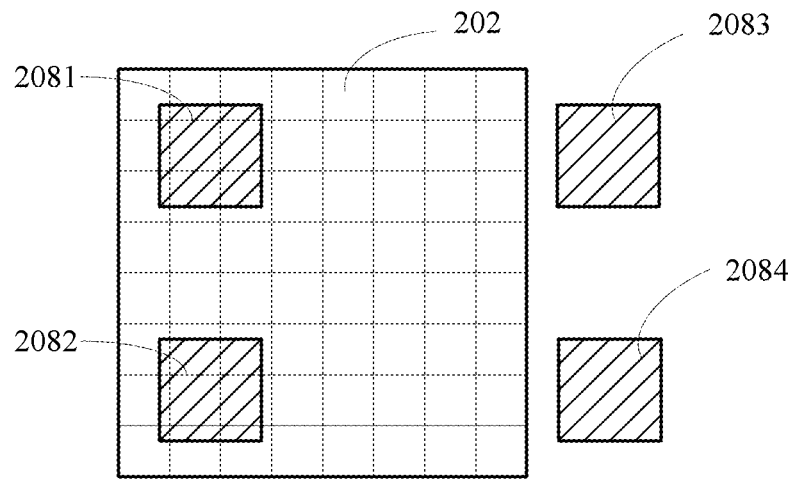

FIG. 6 illustrates an example of the cross section of a PET detector. The PET detector may include a crystal array of 8×8 crystal elements 202 and a semiconductor sensor array of 2×2 semiconductor sensors (e.g., semiconductor sensors 2081, 2082, 2083, and 2084). In some embodiments, one or more of the semiconductor sensors may or may not be coupled to a crystal element 202. A crystal element that is coupled to a given semiconductor sensor is also referred to herein as a crystal element corresponding to the given semiconductor sensor. As an example, semiconductor sensor 2081 and/or semiconductor sensor 2082 may be coupled to one or more crystal elements 202 in the crystal array. As another example, semiconductor sensor 2083 and/or semiconductor sensor 2084 are not coupled to a crystal element 202 in some embodiments.

In another embodiment of the present invention, the semiconductor sensor array covers the light output surface of the crystal array completely or partially, so that the semiconductor sensor may receive photons at the light output surface.

Figure 7:
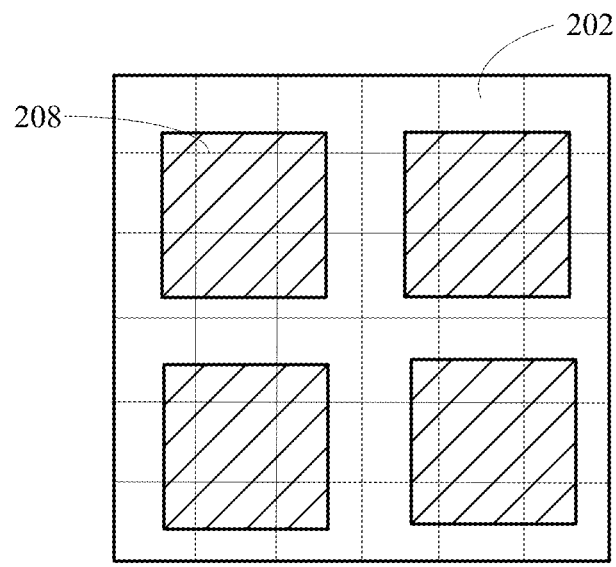

FIG. 7 illustrates an example of the cross section of the PET detector in accordance with some embodiments of the disclosure. In some embodiments in which the semiconductor sensor array covers the light output surface of the crystal array completely, each crystal element 202 in the crystal array may be covered by the semiconductor sensor. As such, each crystal element 202 in the crystal array is coupled to at least one semiconductor sensor 208 in the semiconductor sensor array and thus corresponds to the at least one semiconductor sensor. The corresponding semiconductor sensor may be part of the semiconductor sensors in the array or all of the semiconductor sensors in the array. For example, one or more semiconductor sensors 208 may be coupled with a given crystal element 202 and thus correspond to the given crystal element 202.

In some embodiments in which the semiconductor sensor array partially covers the light output surface of the crystal array, one or more portions of the crystal array (e.g., one or more crystal elements) are coupled to the corresponding semiconductor sensor 208. In an embodiment of the present disclosure, as shown in FIG. 3, each semiconductor sensor 208 in the semiconductor sensor array is coupled with one or more crystal elements 202 in the crystal array. The semiconductor sensor array covers the light output surfaces of part of the crystal elements in the crystal array. In another embodiment, as shown in FIG. 6, a portion of the semiconductor sensor array are coupled to the crystal elements in the crystal array. The portion of the semiconductor sensor array may include one or more semiconductor sensors. The portion of the semiconductor sensor array may cover the light output surfaces of one or more crystal elements in the crystal array.

In order to determine the positions of the photons which are excited by the γ ray inside the crystal elements according to the output of the semiconductor sensors more conveniently, the center-of-gravity of the semiconductor sensor array and the center-of-gravity of the crystal array may be set coincidently. When the center-of-gravity of the semiconductor sensor array and the center-of-gravity of the crystal array coincide, the positions of the photons may be determined using the center-of-gravity readout method. As shown in FIGS. 3-5, the semiconductor sensor array may include multiple semiconductor sensors 208 that are arranged in an array. The crystal array comprises multiple crystal elements 208 that are arranged in an array. As such, the center-of-gravity of the semiconductor sensor array and the center-of-gravity of the crystal array coincide. The center-of-gravity of the crystal array may be determined by a calculation of dimensions of the crystal array based on the center-of-gravity of the semiconductor sensor array. The positions of the photons may then be determined by the center-of-gravity of the crystal array.

In some implementations, the semiconductor sensor array may include three or more semiconductor sensors. The semiconductor sensors may be and/or include photoresistors, photodiodes, phototransistors, and/or any other suitable device that may be used as a semiconductor sensor in accordance with embodiments of the present disclosure. Wherein the resolution of the crystal elements in the image is related to the number and positions of the semiconductor sensors. In some implementations, persons skilled in the art may adjust the number and positions of the semiconductor sensors in the above-mentioned embodiments according to the requirement of the resolution of the crystal elements in the image. For example, as shown in FIGS. 3-5, the semiconductor sensor array may include any suitable number of semiconductor sensors (e.g., four, five, eight, etc. semiconductor sensors) to achieve various resolutions of the crystal elements in images generated by the PET detector.

The resolution of the crystal elements in the image may refer to the resolution of the corresponding position of each crystal element in the image obtained by the PET detector. When the resolution of the crystal elements in the image is higher, the corresponding position of each crystal element is clearer, and the boundaries between different positions of the crystal elements are sharper.

As described above, the PET detector may have any suitable number of semiconductor sensors. The semiconductor sensors may be arranged in various manners. For example, a semiconductor sensor of the PET detector may or may not correspond to a crystal element in the crystal array. As such, embodiments of the present disclosure address the deficiencies of existing PET detectors by providing a PET detector with enhanced resolution and by reducing the number of semiconductor sensors used in the PET detector.

In some embodiments, the PET detector may generate an optical signal and may convert the optical signal into an electrical signal (e.g., using the semiconductor sensors on the base of inner photoelectric effect). Compared with the devices which convert optical signals into electrical signals based on external photoelectric effect, the semiconductor sensors have the advantages of small size, light weight, imperviousness to magnetic fields while working, etc.

For example, the common used diameter dimensions of PMTs which convert optical signals into electrical signals based on external photoelectric effect are ¾ inch, 1 inch and 1.5 inches. And the dimensions of diameter of semiconductor sensors are usually $3\times3$ mm$^2$ or $6\times6$ mm$^2$. When contacting the crystal elements, the contact area of a 1-inch PMT is about $8\times8$ cm$^2$, while that of a $6\times6$ mm$^2$ semiconductor sensor is about $2\times2$ cm$^2$. The larger the contact area of the crystal elements is, the more the number of events received in unit time is, which means the detector's dead time becomes longer and the signals would be more likely to pile up, thus the sensitivity of the PET detector gets worse. Calculations show that the number of events received by a 1-inch PMT in unit time is 16 times as much as that by a 6×6 mm² semiconductor. Under the same circumstance, the dead time of a PET detector with PMT sensors is about 2-3 times as much as that of a PET detector with semiconductor sensors. Therefore, the PET detector with semiconductor sensors has a higher sensitivity. Furthermore, the PET detector with semiconductor sensors as previously described may work free from the influence of magnetic fields, which makes it more convenient for the user.

In some embodiments, the light-splitting structures may be coupled to the surface of the crystal elements in any suitable manner. For example, the light-splitting structures may be coupled to the surfaces of one or more crystal elements that form a portion of the crystal array. As another example, each crystal element 202 may be coupled to one or more light-splitting structures. The position and dimensions of light-splitting structures set on each crystal element may or may not be the same.

Figure 8:
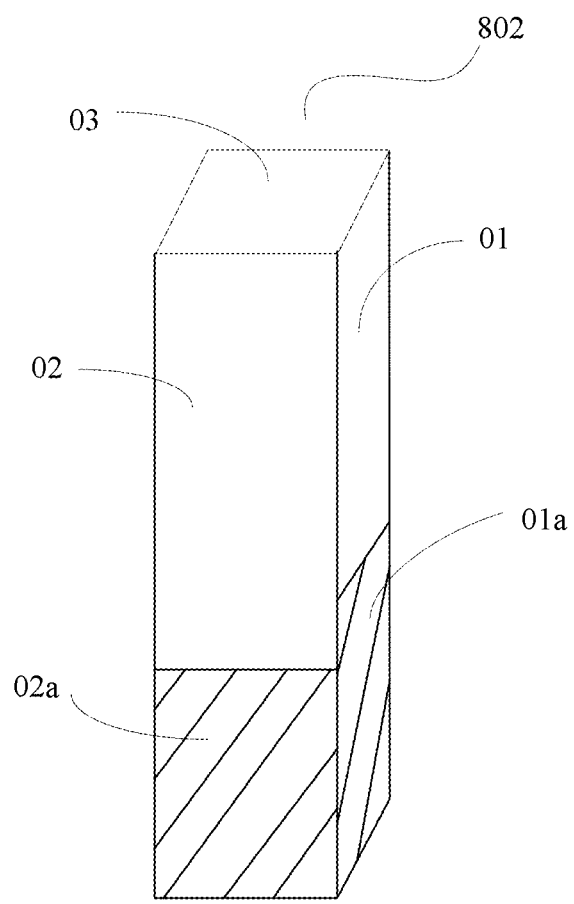
FIG. 8 is a diagram illustrating a light-splitting structure coupled to a crystal element according to some embodiments of the present disclosure.

FIG. 8 illustrates an example 802 of a crystal element in accordance with some embodiments of the disclosure. As shown, crystal element 802 may have multiple surfaces, such as surfaces 01, 02, and 03. One or more light-splitting structures (e.g., light-splitting structures 01a and 02a) may be mounted on one or more surfaces of the crystal element 802. In some embodiments, the area of a light-splitting structure mounted on a surface of crystal element 802 (e.g., surface 03 that defines a light output surface of crystal element 802) may be smaller than the area of the surface of crystal element 802. The areas of the light-splitting structures mounted on each crystal element may or may not be the same. For example, in some embodiments in which surface 03 may be used to define a light output surface of crystal element 802, light-splitting structures 01a and 02a may be mounted on surface 01 and surface 02, respectively. The area of light-splitting structure 01a may or may not be the same as that of light-splitting structure 02a. In some embodiments, a light-splitting structure mounted on surface 03 (not shown in FIG. 8) may be smaller than surface 03.

Upon receiving a γ ray at the crystal element 802, the γ ray excites multiple photons inside the crystal element 802. In some embodiments, one or more of the photons may enter into a semiconductor sensor corresponding to surface 03 (e.g., a semiconductor sensor coupled to surface 03). One or more of the other photons may enter into one or more other crystal elements of the crystal array through one or more other surfaces of the crystal element 802 (e.g., surface 01, surface, 02, etc.). The other photons may then transmit between the other crystal elements, and may ultimately enter into one or more semiconductor sensors corresponding to the other crystal elements. In some embodiments, the PET detector may determine the position of photon excitation inside the crystal elements based on an output of the semiconductor sensors.

In some embodiments, one or more of the light-splitting structures mounted on crystal element 802 may be and/or include one or more light-reflective films and/or white light-reflective coatings on the surface of crystal element, etc. Each of the light-splitting structures may be configured to have a particular size and/or be positioned in a particular portion of a surface of the crystal element. The number of photons that may pass through a given light-splitting structure may be determined based on the size of the given light-splitting structure and the position of the light-splitting structure on the surface. The different photons numbers further lead to the numbers of photons that each semiconductor sensor received are different, which ultimately affect the analyzed position results of photons according to the output of semiconductor sensor. Taking two crystal elements as an example, various configurations of the light-splitting structures coupled to one of the crystal elements may be used to cause various numbers of photons excited in the crystal element to be entered into the other crystal element.

Figure 9:
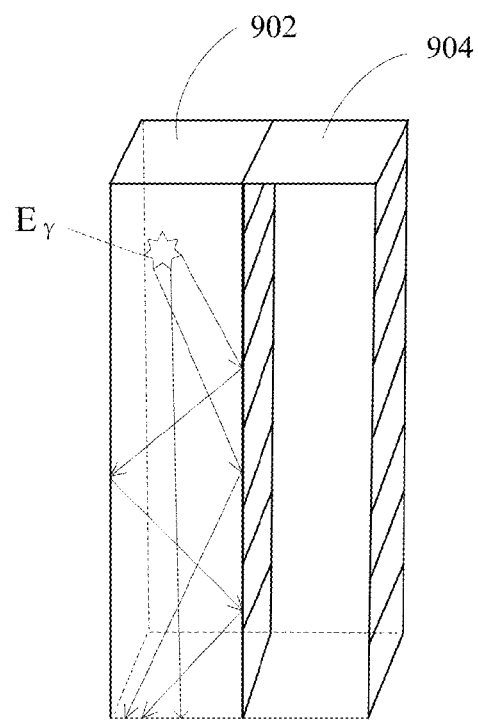
FIG. 9 is a diagram illustrating a transmission path of a photon between two crystal elements according to one embodiment of the present disclosure.
Figure 10:
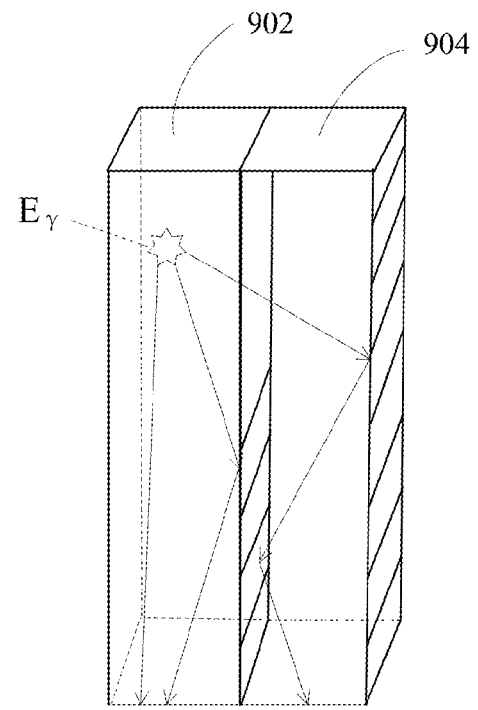
FIG. 10 is a diagram illustrating a transmission path of a photon between two crystal elements according to another embodiment of the present disclosure.

For example, as shown in FIGS. 9 and 10, the PET detector may include crystal elements 902 and 904 that are adjacent to each other. As illustrated using the dash area, a light-splitting structure (e.g., a white light-reflective coating) is mounted on a surface of the crystal element 904 that is adjacent to a surface of crystal element 902. The surface of crystal element 904 is also referred to as the "contact surface" herein. In some embodiments, a γ ray may excite multiple photons (e.g., three photons) in the crystal element 902. When the photons that are excited inside the crystal element 902 transmit to the white light-reflective coating, the photons reflect as an effect of the white light-reflective coating, instead of entering into the crystal element 904 through the white light-reflective coating. In some embodiments, when the photons transmit to a contacting surface which is not part of the white light-reflective coating, the photons may enter into the crystal element 904 through the contacting surface which is not part of the white light-reflective coating.

For example, as shown in FIG. 9, the area of the white light-reflective coating may be equal to or greater than that of the contact surface of crystal element 902. In such an example, neither of the two photons that transmit to the contact surface may enter into the crystal element 904. As another example, as shown in FIG. 10, the white light-reflective coating covers a portion of the contact surface (e.g., about half of the contact surface). In such an example, one of the two photons that transmit to the contact surface may enter into the crystal element 904.

As described above, various configurations of light-splitting structures on surfaces of a particular crystal element may be used to cause various numbers of photons to enter into other crystal elements. To clearly identify each crystal, the area of the light-splitting structure mounted on a crystal element may be adjusted by adjusting the probability that photons appear in a crystal element.

In some embodiments, the probability that photons appear in a selected crystal element in the crystal array may be determined using the following formula:

$$P(m) = \frac{N!}{m!(N-m)!} p^m (1-p)^{(N-m)}, \quad (1)$$

where N represents the total number of photons that are excited inside any crystal element other than the selected crystal element in the crystal array. m represents the number of photons that occur inside the selected crystal element when the total number of photons excited inside any crystal element is N. p represents a probability that when a photon is excited in the arbitrary crystal unit the photon happen to occur in the selected crystal unit. P represents the probability of the number of the photons that occur inside the selected crystal element is m when the total number of photons excited inside any crystal element is N.

The area of a light-splitting structure on a crystal element may be adjusted based on formula (1). In some embodiments, one or more values of N, m, and P may be determined based on tests and/or experiments. An image generated by the PET detect may need to have a certain resolution of crystal elements (e.g., a resolution that is equal to or greater than a threshold) to be used to determine the location in a crystal element where photons are excited, when analyzing the location where photons are excited according to the output of semiconductor sensors. In some embodiments, if more photons appear inside each crystal element in the crystal array, the resolution of each crystal element in the image is higher. When the probability of occurrence of photon inside the selected crystal element P meets the resolution requirement of crystal element in the image, the crystal element will be set according to the area of light-splitting structure corresponding to the probability P.

A light-splitting structure coupled to the selected crystal element may be configured based on the probability that photons would appear in the selected crystal element. In some embodiments, a PET detector may determine that the probability that photons appear in the selected crystal element is higher than a predetermined value (e.g., a probability that is equal to or greater than a threshold) and may configure the light-splitting structure based on the determination. For example, a special machine to assemble PET detectors may reduce the area of the light-splitting structure on the crystal element. As another example, the special machine may adjust the position of the light-splitting structure on the crystal element. As still another example, the special machine may reduce the same time and adjust the position of the light-splitting structure on the crystal element. In some embodiments, the PET detector may determine that the probability that photons appear in the selected crystal element is not high (e.g., a probability that is not greater than a threshold) and may configure the light-splitting structure based on the determination. For example, the special machine may increase the area of the light-splitting structure on the crystal element. As another example, the special machine can adjust the position of the light-splitting structure on the crystal element. As still another example, the special machine may increase the area of light-splitting structure and may adjust the position of light-splitting structure on the crystal element.

In one embodiment of this invention, a 1×10 crystal array is assembled, wherein the crystal array includes 10 crystal elements and light-splitting structures are set on each crystal element. Taking a PET detector comprising the 1×10 crystal array as an example, a detailed illustration is given on the adjusting of light-splitting structures set on each surface of crystal element according to formula (1).

Figure 11:
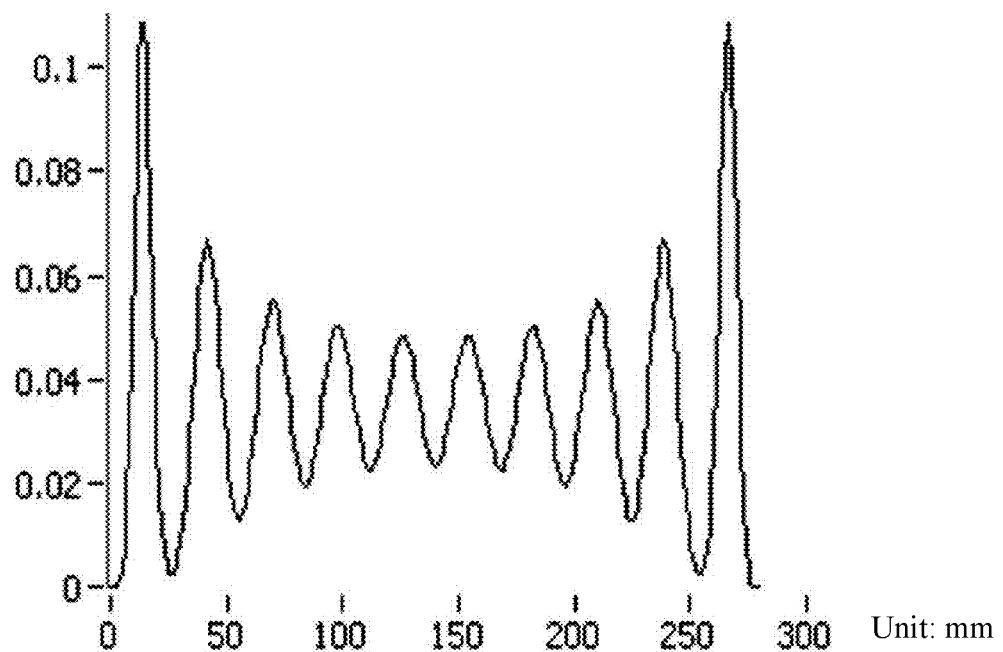
FIG. 11 is a diagram illustrating the probability distribution of photons that appear inside a crystal element in the crystal array before adjusting a diagram illustrating the probability distribution of photons that appear inside a crystal element in the crystal array before adjusting in accordance with some embodiments of the disclosure.
Figure 12:
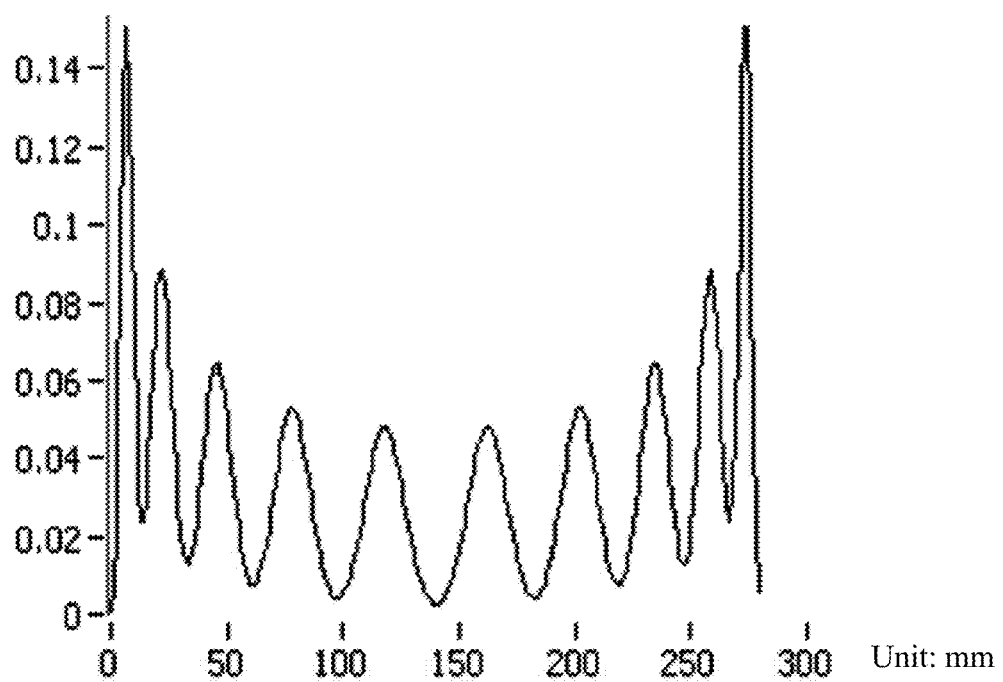
FIG. 12 is a diagram illustrating a distribution of the probability that photons appear in a crystal element of a 1×10 crystal array after adjustment of a PET detector in accordance with some embodiments of the disclosure.

As shown in FIG. 11 and FIG. 12, FIG. 11 illustrates the probability distribution of photons that appear inside a crystal element in the crystal array before adjusting. FIG. 12 illustrates the probability distribution of photons that appear inside a crystal element in the crystal array after adjusting. The horizontal axis in the FIG. 11 and FIG. 12 represents the positioning of each crystal element, in which the waveform between the two adjacent wave troughs represents the probability distribution of photons that occur in different positioning inside one crystal element. The vertical axis represents the probability distribution of photons that appear inside each crystal element. The waveform represents the probability distribution of photons that occur in the crystal element. If the peak-to-trough ratio of a waveform is great, the resolution of crystal element in the image that obtained is high.

By comparing FIG. 11 to FIG. 12, it is suggested that most values of peak-to-trough ratio of the waveforms that represent the probability distribution of photons that appear in the crystal element in FIG. 12 are higher than the corresponding ones in FIG. 11. That is to say, a PET detector with a higher resolution may be obtained by adjusting the light-splitting structures set on the surface of a crystal element according to formula (1).

In a specific embodiment, to better satisfy the resolution requirements of crystal element on images, when setting the light-splitting structures on the surfaces of crystal elements, light-receiving areas of the semiconductor sensors, relative positioning among semiconductor sensors, and relative positioning between semiconductor sensors and the crystal array may also be used to set the light-splitting structures on the crystal elements. That is to say, settings of the light-splitting structures on the surfaces of crystal elements may also need to match light-receiving areas of the semiconductor sensors, relative positioning among semiconductor sensors, and relative positioning between semiconductor sensors and the crystal array.

Wherein, the light-receiving areas of the semiconductor sensors may already be determined when the semiconductor sensors are dispatched from the manufacturer. For example, a conventional semiconductor sensor may have a light-receiving area of 3×3 $mm^2$ or 6×6 $mm^2$. In practice, in order to further minimize the size of the PET detector, semiconductor sensors with light-receiving areas of 3×3 $mm^2$ may be chosen.

Under common conditions, among the factors of light-receiving areas of the semiconductor sensors, relative positioning among semiconductor sensors, relative positioning between semiconductor sensors and the crystal array, and the probability of photons occurring in each crystal elements, when one or more of the mentioned factors are determined, the PET detector may satisfy the resolution requirements of crystal element on images by adjusting other parameters of the factors.

For example, when the light-receiving areas of the semiconductor sensors are determined, relative positioning among semiconductor sensors, relative positioning between semiconductor sensors and the crystal array, and the probability of occurrence of photon in each crystal element may be adjusted to satisfy the resolution requirements of crystal element on images. When the light-receiving areas of the semiconductor sensors, and the probability of photons occurring in each crystal elements are determined, relative positioning among semiconductor sensors, and relative positioning between semiconductor sensors and the crystal array may be adjusted to satisfy the resolution requirements of crystal element on images. When the light-receiving areas of the semiconductor sensors, relative positioning among semiconductor sensors, and relative positioning between semiconductor sensors and the crystal array are determined, the probability of occurrence of photon in each crystal element may be adjusted to satisfy the resolution requirements of crystal element on images.

Therefore, when setting the PET detector in embodiments of the present invention, the areas of light-splitting structures on each crystal elements of the crystal array may be adjusted first, and followed by the semiconductor sensor array being set according to the light output surfaces of the crystal. Alternatively, the semiconductor sensor array may be set according to the light output surfaces of the crystal first, followed by adjusting the areas of light-splitting structures on each crystal elements of the crystal array. Regardless of the order of the two, it suffices to satisfy the resolution requirements of crystal element on images.

When the PET detector is being used to detect the location where photons are excited, as described above, one crystal element in the crystal array receives a γ ray, and the γ ray excites photons in the crystal element. After the semiconductor sensors have received the photons from the light output surface of the crystal array, the locations where the photons are excited by the γ rays in the crystal elements may be determined according to the output of the semiconductor sensors.

When determining the locations where the photons are excited based on the output of the semiconductor sensors and using the center-of-gravity readout method, the total energy of excited photons (E), the energy of photons received by semiconductors in one row (X1), and one of the columns of the energy of photons received by semiconductors (Y1) need to be calculated. By such calculation, the row location of the excited photons may be x=X1/E, and the column location may be y=Y1/E. The location where the photons are excited may be determined by the values of x and y. Wherein, the total energy (E) of all the excited photons may be equal to the sum of the energies detected by each semiconductor sensors of the PET detector. One of the rows of the energy of photons received by semiconductors (X1) may be equal to the sum of the energies detected by each semiconductor sensors in one of the rows. One of the columns of the energy of photons received by semiconductors (Y1) may be equal to the sum of the energies detected by each semiconductor sensors in one of the columns.

Currently, when determining the location where photons are excited, the common procedure is: reading the output data from each semiconductor sensors, and determining the location of photons according to the readings of data. In other words, when using the above mentioned procedure, the amount of data read and the number of semiconductor sensors are the same. In such a way, when the PET detector includes multiple semiconductor sensors, the amount of data processed to determine the location where photons are excited is increased, and therefore, the difficulty to determine the location where photons are excited is also increased. For example, when using a PET detector as shown in FIG. 5 to determine the location where photons are excited, since the PET detector includes 8 semiconductor sensors, the number of sets of data totals 8 after reading the data from the semiconductor sensors. In further processing to determine the location where photons are excited, the 8 sets of data need to be processed to determine the location where photons are excited, and the difficulty of determining the location where photons are excited may be increased.

As a solution to the above mentioned situation, in an embodiment of the present invention, when setting the PET detector, the PET detector may further include a first amplifier, and the input terminal of the first amplifier may be connected with the output terminal of a predetermined row of semiconductor sensors in the semiconductor sensor array. Wherein, number of the first amplifier may be set according to the row number of the semiconductor sensor array, and number of the first amplifier may be equal to or less than the row number of the semiconductor sensor array. When connecting the input terminal of the first amplifier with the output terminal of a predetermined row of semiconductor sensors in the semiconductor sensor array, each input terminal of the first amplifier are connected with each output terminal of a predetermined row of semiconductor sensors in the semiconductor sensor array correspondingly, and each input data of the first amplifier is also an output terminal of a predetermined row of semiconductor sensors in the semiconductor sensor array. In such a way, when using center-of-gravity readout method to determine the location where photons are excited, the output of a row of semiconductor sensors may be determined directly according to the output of the first amplifier, and it is not required to read output of every semiconductor sensor. The amount of data processed to determine the location where photons are excited, and the difficulty to determine the location of photons may be both reduced.

In the same manner, when setting the PET detector, the PET detector may further include a second amplifier, and the input terminal of the second amplifier may be connected with the output terminal of a predetermined column of semiconductor sensors in the semiconductor sensor array. For detailed descriptions regarding setting the second amplifier, reference should be made to the descriptions regarding the first amplifier, which will not be repeated here.

In practice, the PET detector may only include either the first amplifier or the second amplifier, or include both the first amplifier and the second amplifier. When the PET detector includes both the first amplifier and the second amplifier, the amount of data processed when the location where photons are excited is determined may be further reduced to determine the location where photons are excited, as well as the difficulty to determine the location of photons.

Figure 13:
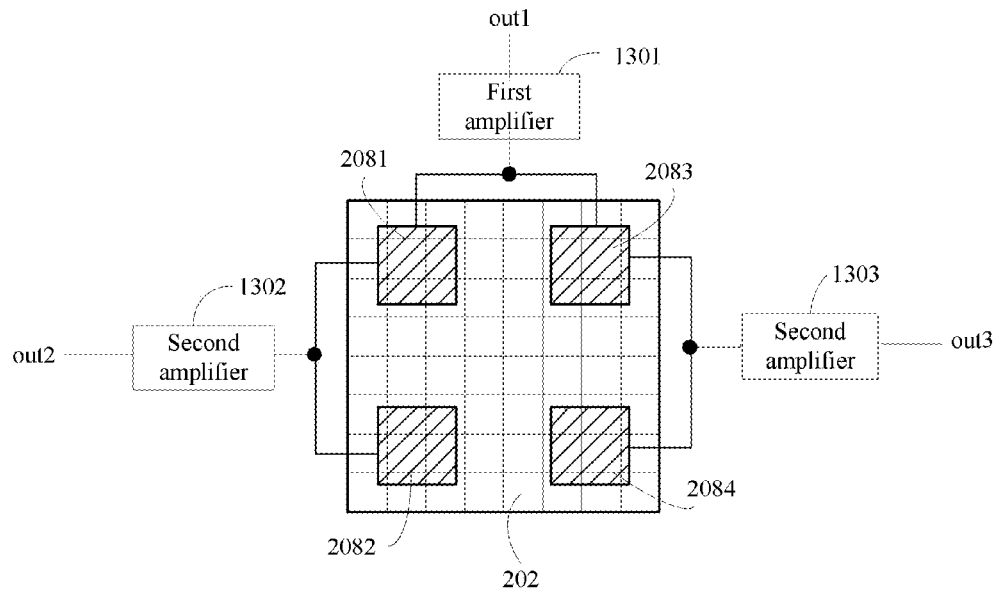
FIG. 13 is a structural diagram illustrating a cross section of a PET detector according to some embodiments of the present disclosure.

Taking the PET detector shown in FIG. 13 as an example, an illustration of the setting and detecting of the PET detector according to embodiments of the present invention is given.

As shown in FIG. 13, the PET detector include crystal elements 202, which are arranged in an 8×8 crystal array, and semiconductor sensors 2081-2084, which are arranged in a 2×2 semiconductor sensor array.

When setting the PET detector, after specific semiconductor sensors are selected, the relative positioning among semiconductor sensors 2081-2084, and the relative positioning between semiconductor sensors and the crystal array may first be determined, then the light-splitting structures on the surfaces of crystal elements may be further adjusted, to satisfy the resolution requirements of crystal element on images acquired by the PET detector.

Figure 14:
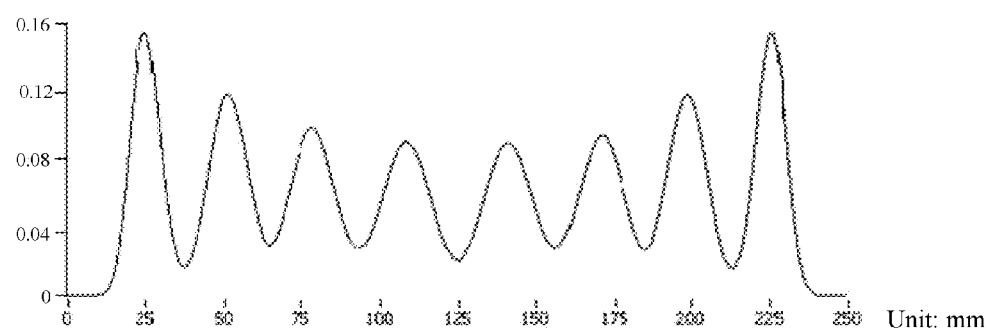
FIG. 14 is a diagram illustrating a distribution of the probability that photons appear in each crystal element of the PET detector in FIG. 13.

Wherein, when adjusting the areas of the light-splitting structures set on the surface of each crystal element 202, the adjustment may be the area of the light-splitting structures corresponding to a probability, wherein the probability meets the resolution condition of crystal elements in the image when adjusting the probability of the photon occurrence inside each crystal element 202. For example, it is possible to make the probability distribution of the photon occurrence inside each crystal element 202 reach the probability distribution shown in FIG. 14. After adjusting the areas of the light-splitting structures set on the surface of each crystal element, set the semiconductor sensor array opposite to the light output surface of the crystal array, the PET detector may be obtained.

In order to subsequently determine the position of photon generation according to the output of the semiconductor sensors more conveniently, it is also possible to set a first amplifier and a second amplifier in the obtained PET detector. When setting the first amplifier, it is possible to set in the row where the semiconductor sensors 2081, 2083 reside, or to set in the row where the semiconductor sensors 2082, 2084 reside, or to set in the row where the semiconductor sensors 2081, 2083 reside and in the row where the semiconductor sensors 2082, 2084 reside at the same time. In some embodiments of the present invention, for example, set the first amplifier 1301 in the row where the semiconductor sensors 2081, 2083 reside. Likewise, when setting the second amplifier, it is possible to set in the column where the semiconductor sensors 2081, 2082 reside, or to set in the column where the semiconductor sensors 2083, 2084 reside, or to set in the column where the semiconductor sensors 2081, 2082 reside and in the column where the semiconductor sensors 2083, 2084 reside at the same time. In some embodiments of the invention, for example, set the second amplifier 1302 in the column where the semiconductor sensors 2081, 2082 reside, and set the second amplifier 1303 in the column where the semiconductor sensors 2083, 2084 reside at the same time.

Wherein, the output of the first amplifier 1301 is out1, and the output of the second amplifier 1302 is out2, and the output of the second amplifier 1303 is out3. Thus, the total energy of photons E=out2+out3, wherein the received photons energy by one row of the semiconductor sensors X1=out1, and the received photons energy by one column of the semiconductor sensors Y1 =out2 or Y1=out3. It is important to note that, after determining the one row and the one column, the position of photon generation may be determined in the coordinates wherein the one row is X-axis and the one column is Y-axis. For example, assume the received photon energy Y1=out2 by the one column of the semiconductor sensors, according to the center-of-gravity readout method, the row of the position of photon generation x=X1 /E=out1/(out2+out3), y=Y1/E=out2/(out2+out3). Thus, the position of photon generation may be determined according to the outputs of the first amplifier 1301, the second amplifier 1302, and the third amplifier 1303. In comparison to determining the position of photon generation by the outputs of semiconductor sensors 2081, 2082, 2083 and 2084, it effectively reduces the amount of data processing when determining the position of photon generation.

Figure 15:
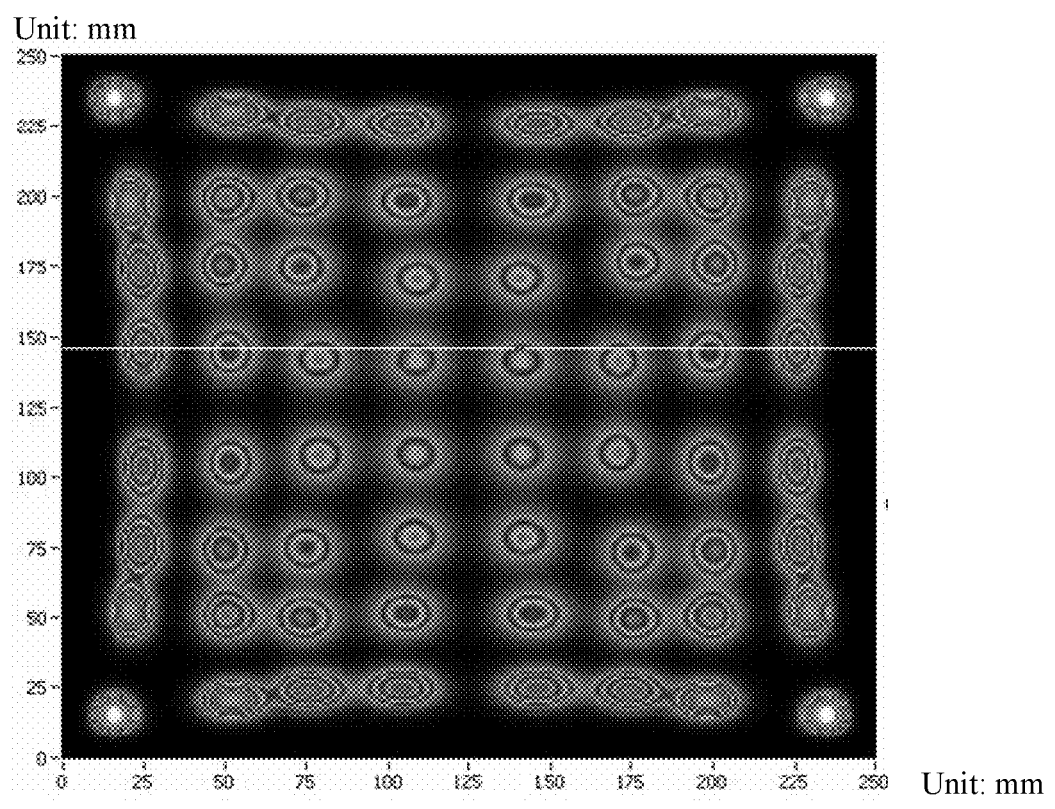
FIG. 15 is a two-dimension image of each crystal element location generated by the PET detector in FIG. 13.

By detection simulation by the PET detector, the obtained two-dimensional image analytic results regarding the position of each crystal element is shown in FIG. 15, wherein the horizontal ordinate represents the position of the columns where each crystal element resides and the vertical ordinate represents the position of the rows where each crystal element resides. It is shown by FIG. 15 that each crystal element is arranged evenly, and each crystal element is clearly visible, such that the resolution of the crystal elements in the figure is relatively high. The photon positions may be obtained precisely by applying the PET detector to detect the position of photon generation.

To help those skilled in the art understand and practice the embodiments of the present invention, the methods corresponding to the PET detector will be illustrated below.

Figure 16:
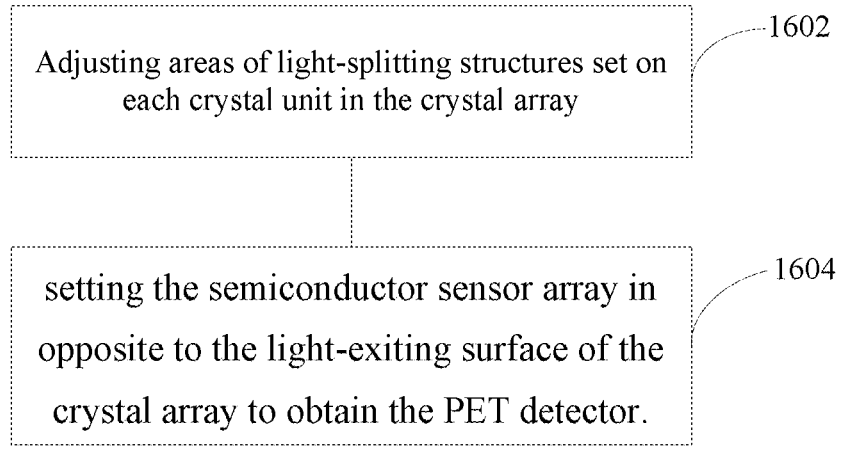
FIG. 16 is a flow chart illustrating a method for configuring a PET detector according to one embodiment of the present invention.

As shown in FIG. 16, some embodiments of the present invention also provides a method for setting up PET detector, the method may comprise:

Step 1602: adjusting areas of light-splitting structures set on each crystal element in the crystal array.

wherein, when adjusting areas of light-splitting structures set on each crystal element in the crystal array, adjusting the probability of occurrence of photon in the each crystal element, when the probability of occurrence of photon in the each crystal element fulfills a resolution condition of the crystal elements in an image, set the crystal elements according to the area of the light-splitting structure corresponding to the probability of occurrence of photon.

When adjusting the probability of occurrence of photon in the each crystal element, adjusting the probability of occurrence of photon in a selected crystal element according to the equation (1).

Step 1604: setting the semiconductor sensor array in opposite to the light output surface of the crystal array, to obtain the PET detector.

It should be noted that, in specific embodiments of the present invention, the execution order of Step 1602 and Step 1604 is not limited. That is to say, it is possible to adjust the areas of light-splitting structures set on each crystal element in the crystal array first, then set the semiconductor sensor array in opposite to the light output surface of the crystal array, or set the semiconductor sensor array in opposite to the light output surface of the crystal array first, then adjust the areas of light-splitting structures set on each crystal element in the crystal array; the above description is not limiting.

When applying the setting method in the embodiments of the present invention to set up the PET detector, one may refer to the description of embodiments of PET detectors illustrated above, and further discussion will not be provided here.

Figure 17:
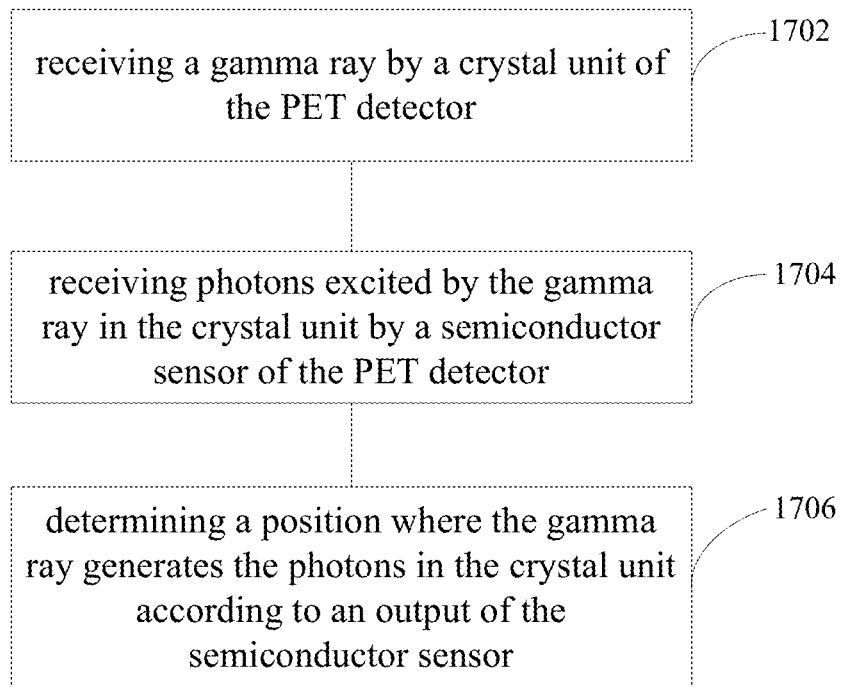
FIG. 17 is a flow chart illustrating a method for providing a PET detector according to one embodiment of the present invention.

As shown in FIG. 17, embodiments of the present invention also provides a method for detecting with PET detector, the method may comprise:

Step 1702: receiving a gamma ray by a crystal element of the PET detector.

Step 1704: receiving photons excited by the gamma ray in the crystal element by a semiconductor sensor of the PET detector;

Among them, Step 1702 and Step 1704 may be executed referring to the description of embodiments of PET detectors illustrated above.

Step 1706: determining a position where the gamma ray generates the photons in the crystal element according to an output of the semiconductor sensor.

In practice, the location where photons are excited inside the crystal elements by the gamma ray may be determined by the center-of-gravity readout method, referring to the description of embodiments of PET detector illustrated above.

Although the present invention is disclosed as above, the present invention is not limited thereto. Any skilled in the art, without departing from the spirit and scope of the present invention, may come up with various changes and modifications, and therefore the scope of protection regarding the present invention should be defined by the claims.

The invention claimed is:

1. A positron emission tomography (PET) detector, the PET detector comprising :
   a crystal array comprising a plurality of crystal elements arranged in a single layer and a number of light-reflective films, the light-reflective films being mounted on surfaces of the crystal elements; and
   a semiconductor sensor array comprising a plurality of semiconductor sensors, the semiconductor sensors being configured to be coupled with only a portion of crystal elements of the crystal array, wherein the number of the crystal elements of the crystal array is more than the number of the semiconductor sensors of the semiconductor sensor array.

2. The PET detector according to claim 1, more than one crystal element of the plurality of crystal elements in the crystal array being coupled with one semiconductor sensor of the semiconductor sensor array.

3. The PET detector according to claim 1, at least one semiconductor sensor of the semiconductor sensor array being coupled with one crystal element of the plurality of crystal elements in the crystal array.

4. The PET detector according to claim 1, the coupling comprising a contact between the semiconductor sensors and the crystal elements directly or through an adhesive material.

5. The PET detector according to claim 1, a center-of-gravity of the semiconductor sensor array coinciding with a center-of-gravity of the crystal array.

6. The PET detector according to claim 1, the light-reflective films defining a light output surface of the crystal array jointly, the semiconductor sensor array completely or partially covering the light output surface.

7. The PET detector of claim 6, wherein each crystal element of the crystal array corresponds to a light output surface that is part of the crystal element or a different crystal element of the crystal array.

8. The PET detector according to claim 1 further comprising a first amplifier, an input terminal of the first amplifier being connected with an output terminal of a semiconductor sensor in a predetermined row of the semiconductor sensor array.

9. The PET detector according to claim 1 further comprising a second amplifier, an input terminal of the second amplifier being connected with an output terminal of a semiconductor sensor in a predetermined column of the semiconductor sensor array.

10. The PET detector according to claim 1, the light-reflective films on the crystal elements being set based on light-receiving areas of the semiconductor sensors, a relative location between the semiconductor sensors, relative positioning between the semiconductor sensors and the crystal array.

11. The PET detector according to claim 1, the number or positioning of the semiconductor sensors relating to a spatial resolution of the crystal elements in an image.

12. The PET detector according to claim 1, wherein a distance between two adjacent semiconductor sensors is larger than a distance between two adjacent crystal elements.

13. The PET detector according to claim 1, wherein there are two adjacent semiconductor sensors spanning across at least one of the crystal elements.

14. The PET detector according to claim 1, at least one crystal element of the plurality of crystal elements having a surface including an upper side, a lower side, and a surrounding surface between the upper side and the lower side, and the light-reflective film being mounted on at least a portion of the surrounding surface of the at least one crystal element of the plurality of crystal elements.

15. A positron emission tomography (PET) detector, the PET detector comprising:
    a crystal array comprising a plurality of crystal elements arranged in a single layer, each of the plurality of crystal elements extending along an up-to-down direction, and having an upper side, a lower side, and a surrounding surface between the upper side and the lower side;
    a light-reflective film mounted on the surface of at least one crystal element of the plurality of crystal elements; and
    a semiconductor sensor array comprising a plurality of semiconductor sensors, the semiconductor sensors being configured to be coupled with only a portion of crystal elements of the crystal array, wherein the number of the crystal elements of the crystal array is more than the number of the semiconductor sensors of the semiconductor sensor array.

16. The PET detector according to claim 15, wherein the plurality of crystal elements have a same length.

17. The PET detector according to claim 15, wherein the light-reflective films on at least one crystal element of the plurality crystal elements in the crystal array have different areas.

18. The PET detector according to claim 15, wherein the semiconductor sensors are directly coupled with crystal elements.

* * * * *